(12) United States Patent
Liu et al.

(10) Patent No.: US 10,826,014 B2
(45) Date of Patent: Nov. 3, 2020

(54) CURVED-SURFACE DISPLAY SCREEN AND METHOD FOR ASSEMBLING THE SAME

(71) Applicant: Yungu (Gu'an) Technology Co., Ltd., Langfang (CN)

(72) Inventors: Chuo Liu, Langfang (CN); Hua Huang, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 0 days.

(21) Appl. No.: 16/526,065

(22) Filed: Jul. 30, 2019

(65) Prior Publication Data
US 2019/0355924 A1 Nov. 21, 2019

Related U.S. Application Data

(63) Continuation of application No. PCT/CN2018/090434, filed on Jun. 8, 2018.

(30) Foreign Application Priority Data

Oct. 31, 2017 (CN) .......................... 2017 1 1051486

(51) Int. Cl.
| | | |
|---|---|---|
| *G06F 1/16* | (2006.01) | |
| *H01L 51/52* | (2006.01) | |
| *H01L 51/00* | (2006.01) | |
| *H01L 27/32* | (2006.01) | |

(52) U.S. Cl.
CPC ........ *H01L 51/5237* (2013.01); *G06F 1/1652* (2013.01); *H01L 51/0097* (2013.01); *H01L 27/3244* (2013.01); *H01L 2251/5338* (2013.01)

(58) Field of Classification Search
CPC .. H05K 5/0217; H05K 5/0249; G06F 1/1626; G06F 1/1637; G06F 1/1643; G06F 1/1652; G06F 1/1656
See application file for complete search history.

(56) References Cited

U.S. PATENT DOCUMENTS

| | | | |
|---|---|---|---|
| 2006/0273304 A1* | 12/2006 | Cok ................... | H01L 51/0096 257/40 |
| 2007/0146569 A1 | 6/2007 | Nouchi et al. | |
| 2009/0296325 A1* | 12/2009 | Morimoto ............ | H04M 1/185 361/679.01 |

(Continued)

FOREIGN PATENT DOCUMENTS

| | | |
|---|---|---|
| CN | 102077263 U | 5/2011 |
| CN | 103424913 A | 12/2013 |

(Continued)

OTHER PUBLICATIONS

PCT International Search Report dated Aug. 17, 2018 in International Application No. PCT/CN2018/090434.

(Continued)

*Primary Examiner* — Adrian S Wilson
(74) *Attorney, Agent, or Firm* — Rimon PC

(57) ABSTRACT

A method for assembling a curved-surface display screen includes: attaching a flexible display panel to a flexible glass to form an integral body; and mounting the integral body into a frame. The frame surrounds a periphery of the integral body, and a perimeter of the frame is less than that of the integral body.

11 Claims, 3 Drawing Sheets

(56) References Cited

U.S. PATENT DOCUMENTS

| | | | | | |
|---|---|---|---|---|---|
| 2010/0203931 | A1* | 8/2010 | Hynecek | | A45C 11/00 455/575.8 |
| 2010/0277439 | A1* | 11/2010 | Charlier | | G06F 1/1616 345/176 |
| 2014/0002975 | A1* | 1/2014 | Lee | | H05K 5/0017 361/679.01 |
| 2014/0354558 | A1* | 12/2014 | Cho | | G06F 3/0412 345/173 |
| 2014/0380186 | A1* | 12/2014 | Kim | | G09G 3/2092 715/746 |
| 2015/0002398 | A1* | 1/2015 | Nakhimov | | G06F 1/1652 345/163 |
| 2015/0015511 | A1* | 1/2015 | Kwak | | G06F 1/1652 345/173 |
| 2015/0022472 | A1* | 1/2015 | Jung | | G06F 3/0487 345/173 |
| 2015/0036257 | A1* | 2/2015 | Cheng | | G06F 1/1652 361/220 |
| 2015/0043139 | A1* | 2/2015 | Myers | | G06F 1/1652 361/679.3 |
| 2015/0049042 | A1* | 2/2015 | Fujii | | G06F 3/0416 345/174 |
| 2015/0055287 | A1* | 2/2015 | Seo | | G06F 1/1652 361/679.27 |
| 2015/0062525 | A1* | 3/2015 | Hirakata | | G02F 1/133305 349/158 |
| 2015/0210588 | A1* | 7/2015 | Chang | | H05K 3/46 361/750 |
| 2015/0256658 | A1* | 9/2015 | Shin | | G06F 1/1637 455/566 |
| 2015/0258759 | A1* | 9/2015 | Kim | | B32B 37/0053 156/60 |
| 2015/0261033 | A1* | 9/2015 | Shin | | H05K 5/0086 349/58 |
| 2018/0132371 | A1* | 5/2018 | Yeum | | G02F 1/133305 |

FOREIGN PATENT DOCUMENTS

| | | |
|---|---|---|
| CN | 104267537 A | 1/2015 |
| CN | 204215382 U | 3/2015 |
| CN | 104656998 A | 5/2015 |
| CN | 104980535 A1 | 10/2015 |
| CN | 105867546 A | 8/2016 |
| CN | 106847084 A | 6/2017 |
| CN | 206339959 U | 7/2017 |
| CN | 107039604 A | 8/2017 |
| CN | 107193413 A | 9/2017 |
| CN | 107264867 A | 10/2017 |
| CN | 107731102 A | 2/2018 |
| KR | 1020150013987 A | 2/2015 |
| TW | 201133430 A | 10/2011 |
| TW | M497813 U | 3/2015 |
| TW | I544252 B | 8/2016 |
| WO | 9820389 A1 | 5/1998 |

OTHER PUBLICATIONS

Chinese First Office Action for CN Application No. 201711051486.1 dated Mar. 28, 2019.

* cited by examiner

CURVED-SURFACE DISPLAY SCREEN AND METHOD FOR ASSEMBLING THE SAME

CROSS-REFERENCE TO RELATED APPLICATIONS

This application is a continuation of International Application No. PCT/CN2018/090434 filed on Jun. 8, 2018, which claims priority to Chinese patent application No. 201711051486.1 filed on Oct. 31, 2017. Both applications are incorporated herein by reference in their entireties.

TECHNICAL FIELD

The disclosed embodiments relate to the technical field of the curved-surface display screen, and specifically to a curved-surface display screen and a method for assembling the same.

BACKGROUND OF THE INVENTION

A curved-surface display screen generally comprises a formed protective glass and a flexible display panel attached above one another. The common curved-surface display screens are mainly divided into two types: a 2.5D display screen and a 3D display screen. These two types of curved-surface display screens are different only in the difference in the shape of the protective glass. The 2.5D display screen refers to a curved-surface display screen having a plane at the middle portion of the display screen and a curved surface at the periphery of the display screen, while the 3D display screen refers to a curved-surface display screen having a curved surface at both middle portion and periphery thereof.

For either the 2.5D display screen or the 3D display screen, the last step during preparation is assembling, i.e. assembling the flexible display panel and the protective glass to form an integral body. The curved-surface attaching process is often used for assembling of the curved-surface display screen, which specifically comprises: first, holding the protective glass and the flexible display panel respectively by using a curved-surface attaching jig compatible in shape with the protective glass; next, applying an optical adhesive onto an upper surface of the flexible display panel; then, pushing upwards the flexible display panel with the optical adhesive on the surface of the flexible display panel, using the curved-surface attaching jig to stick with the protective glass above the flexible display panel, and forming a curved-surface display panel; and finally, mounting a frame around the curved-surface display panel to form a curved-surface display screen.

As well known, it is difficult to control the uniformity of the flexible display panel during curved-surface attaching process, which makes the attaching process highly difficult during assembling the curved-surface display screen.

SUMMARY OF THE INVENTION

In view of this, the objective of the embodiment(s) of the present invention is to provide a curved-surface display screen and a method for assembling the same, to solve the problem of high difficulty in attaching during assembling the curved-surface display screen.

According to an embodiment of the present invention, a method for assembling a curved-surface display screen includes: attaching a flexible display panel to a flexible glass to form an integral body; and mounting the integral body formed by attaching the flexible display panel to the flexible glass into a frame. The frame surrounds a periphery of the integral body, which is formed by attaching the flexible display panel to the flexible glass, and the frame has a perimeter less than that of the integral body formed by attaching the flexible display panel to the flexible glass.

In an embodiment, the attaching a flexible display panel to a flexible glass to form an integral body is performed in a laminating attaching manner or a rolling conveying attaching manner.

In an embodiment, the mounting the integral body formed by attaching the flexible display panel to the flexible glass into a frame includes: embedding the integral body formed by attaching the flexible display panel to the flexible glass into the frame.

In an embodiment, the mounting the integral body, which is formed by attaching the flexible display panel to the flexible glass, into a frame includes: frame-attaching the frame to the periphery of the integral body formed by attaching the flexible display panel to the flexible glass.

In an embodiment, the frame includes an annular groove extending in a circumferential direction on the inner surface of the frame, embedding the periphery of the integral body formed by attaching the flexible display panel to the flexible glass into the annular groove.

In an embodiment, the attaching a flexible display panel to a flexible glass to form an integral body includes: holding the flexible display panel horizontally by using a rolling conveying attaching apparatus; applying an adhesive onto the flexible display panel; and rolling-pressing the flexible glass onto the adhesive.

In an embodiment, the mounting the integral body formed by attaching the flexible display panel to the flexible glass into a frame includes: frame-attaching a curved frame around the periphery of the integral body formed by attaching the flexible display panel to the flexible glass.

According to an embodiment of the present invention, a curved-surface display screen includes: a flexible display panel; a flexible glass attached on the flexible display panel forming an integral body; and a frame; wherein the frame surrounds a periphery of the integral body, and a perimeter of the frame is less than that of the integral body.

In an embodiment, the frame includes an annular groove extending in a circumferential direction on the inner surface of the frame.

In an embodiment, a shape of a cross section of the annular groove includes an arc shape or a U shape.

In an embodiment, a depth of the annular groove is 3-5 mm.

According to the curved-surface display screen and the method for assembling the same, as provided in the embodiment(s) of the present invention, the flexible glass is used, instead of the preformed bent glass to attach with the flexible display panel. Then, the frame is mounted to the periphery of the integral body formed after the attaching. As the perimeter of the frame is less than that of the integral body, the curved-surface display screen is formed. The essence of the method for assembling a curved-surface display screen according to embodiments of the present invention is that the curved-surface attaching is replaced by the soft-to-soft plane attaching. So that the uniformity of the flexible display panel during attaching process is raised, the difficulty of attaching during assembling the curved-surface display screen is reduced.

DESCRIPTION OF EXEMPLARY EMBODIMENTS

Hereinafter, in order to make the objective(s), technical means and advantages of the present invention clearer and better understood, the present invention will be further described in detail, in connection with the accompanying drawings.

Figure 1:
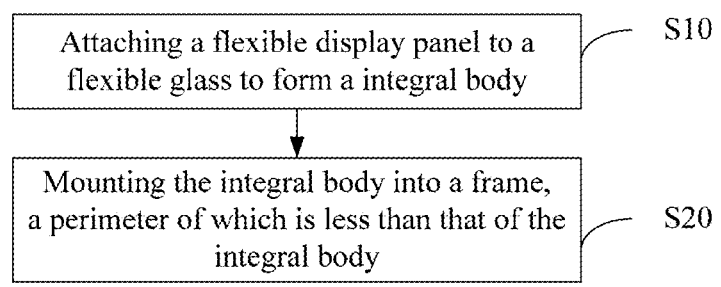
FIG. 1 shows a flowchart of a method for assembling a curved-surface display screen as provided according to an embodiment of the present invention.

FIG. 1 shows a flowchart of a method for assembling a curved-surface display screen as provided according to an embodiment of the present invention. The curved-surface display screen comprises a flexible display panel, a flexible glass stacked above the flexible display panel, and a frame surrounding peripheries of the flexible display panel and the flexible glass. As shown in FIG. 1, the method 100 for assembling the curved-surface display screen includes:

Step S10: attaching the flexible display panel to the flexible glass. The attaching process between the flexible display panel and the flexible glass can be achieved by the prior soft-to-soft attaching apparatus, which is essentially a planar attaching. The common manners for the soft-to-soft planar attaching mainly includes: a laminating attaching manner and a rolling conveying attaching manner. The laminating attaching manner means that the flexible display panel is placed horizontally and the flexible glass is pressed above the flexible display panel. The rolling conveying attaching manner means that the flexible display panel is placed horizontally and the flexible glass is rolling pressed, by a roller, above the flexible display panel from one side gradually to another side. Compared with the laminating attaching manner, the single attaching area of the rolling conveying attaching is small, so that the force occurred during the rolling conveying attaching process is balanced, the fold is avoided, thus the number of bubbles generated can be effectively reduced. Therefore, the rolling conveying attaching is preferred in the present invention.

The flexible glass has a bendable characteristic. As demonstrated by experiments, the flexible glass can bear a bending fatigue testing with a bending radius of 5 millimeter for 100,000 times. When a glass is sufficiently thin, softness of the glass can be reflected, which means that the glass can be bent without breaking. The super-thin flexible glass has various characteristics of the glass, such as hardness, transparency, heat resistance, electric insulation, being gas-proof, as well as relatively stable mechanical and chemical properties in the oxidizing and illumination environment, and the super-thin flexible glass is bendable and lightweight.

The flexible display panel refers to a bendable panel having a display function. In an embodiment, an AMOLED (Active Matrix Organic Light Emitting Diode) panel is selected as the flexible display panel.

Step S20: mounting the integral body formed by attaching the flexible display panel to the flexible glass into a frame. The frame surrounds a periphery of the integral body formed by attaching the flexible display panel to the flexible glass, and a perimeter of the frame is less than that of the integral body formed by attaching the flexible display panel to the flexible glass. The integral body formed by attaching the flexible display panel to the flexible glass, is a plane having the bendable characteristic. When the integral body is mounted into the frame having a perimeter less than that of the integral body, the plane of the integral body is bent to a curved surface.

In an embodiment, the step of mounting the integral body formed by attaching the flexible display panel to the flexible glass into the frame includes: embedding the integral body formed by attaching the flexible display panel to the flexible glass into the frame. The embedding means that fitting the integral body formed by attaching the flexible display panel to the flexible glass into the frame basing on the bendable characteristic of the integral body. So that the integral body is caught securely within the frame due to that the perimeter of the frame is less than that of the integral body formed by attaching the flexible display panel to the flexible glass.

In an embodiment, the step of mounting the integral body formed by attaching the flexible display panel to the flexible glass into the frame comprises: frame-attaching the frame to the periphery of the integral body formed by attaching the flexible display panel to the flexible glass. The frame-attaching means that sticking the frame around the periphery of the integral body using an OCA (Optically Clear Adhesive) or a double-sided adhesive.

In the two specific embodiments as described above, in order to ensure that the flexible display panel and the flexible glass are mounted more securely, an annular groove in a circumferential direction is configured in a circumferential direction on the inner surface of the frame, and embedding the periphery of the integral body formed by attaching the flexible display panel to the flexible glass, into the annular groove. Herein, the inner surface of the frame refers to a surface facing the inside of the frame.

The depth of the annular groove is preferably 3-5 millimeter, thus reliability of the mounting is ensured, and the frame is prevented from being too thick and heavy. The width of the annular groove is equal to a sum of the thickness of the flexible display panel and the flexible glass.

The cross section of the annular groove includes an arc shape or a U shape.

A specific embodiment is provided as follows to illustrate the method 100 for assembling a curved-surface display screen.

Figure 2A:
FIGS. 2a-2d show diagrams of a process for assembling a curved-surface display screen as provided according to an embodiment of the present invention.
Figure 2B:
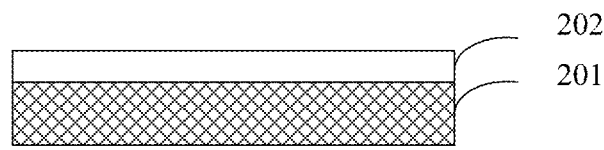
Figure 2C:
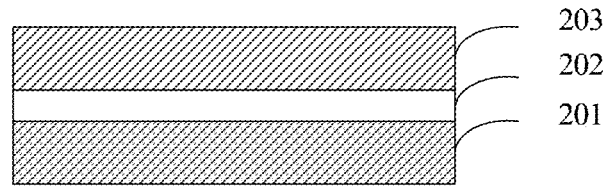
Figure 2D:
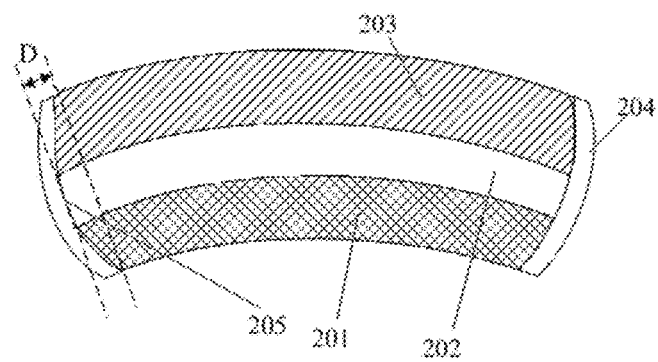

FIGS. 2a-2d show diagrams of a process for assembling a curved-surface display screen as provided in an embodiment of the present invention. The process for assembling a curved-surface display screen includes: referring to Step S10, holding the flexible display panel 201 horizontally by using a rolling conveying attaching apparatus, as shown in FIG. 2a; applying an OCA adhesive 202 onto the flexible display panel 201, as shown in FIG. 2b; and rolling-pressing the flexible glass 203 onto the OCA adhesive 202, as shown in FIG. 2c; referring to Step S20, frame-attaching a curved frame 204 (i.e. a frame having an arc groove) around the periphery of the integral body formed by attaching the flexible display panel 201 to the flexible glass 203, as shown in FIG. 2d.

According to the method for assembling a curved-surface display screen, as provided in the embodiment(s) of the present invention, the flexible glass is used, instead of the formed bent glass, to perform the planar attaching with the flexible display panel to form a bendable integral body. Then, the frame is assembled to the integral body formed by attaching the flexible display panel to the flexible glass, based on the bendable characteristic of the integral body. The curved-surface display screen is formed due to that the perimeter of the frame is less than that of the integral body formed by attaching the flexible display panel to the flexible glass. According to methods for assembling provided in embodiments of the present invention, the planar attaching is used instead of the curved-surface attaching, which makes that the screen body is distributed more uniformly during attaching, the number of bubbles generated can be effectively reduced, the attaching difficulty during assembling of the curved-surface display screen is reduced. A curved-surface attaching apparatus is not additionally to buy as the curved-surface attaching is not needed. It is possible to achieve assembling of the curved-surface display screen by the prior soft-to-soft planar attaching apparatus, thus the cost is saved.

In an embodiment of the present invention, a curved-surface display screen is further provided, the sectional structure of the curved-surface display screen is shown in FIG. 2d. As can be seen from the FIG. 2d, the curved-surface display screen includes: a flexible display panel 201, a flexible glass 203, and a frame 204. The flexible display panel 201 is attached above the flexible glass 203 to form an integral body. The frame 204 surrounds a periphery of the integral body formed by the flexible display panel 201 and the flexible glass 203. A perimeter of the frame 204 is less than that of the integral body, the perimeter of the frame 204 refers to a maximum distance traveled by a circle along the inner surface of the frame 204.

In an embodiment, the frame 204 comprises an annular groove 205 extending in a circumferential direction on the inner surface of the frame 204. The depth D of the annular groove 205 is preferably 3-5 millimeter, thus reliability of the mounting is ensured, and the frame 204 is prevented from being too thick and heavy. The width of the annular groove 205 is equal to a sum of the thickness of the flexible display panel 201 and the flexible glass 203, the width of the OCA adhesive 202 is neglected.

Figure 2E:
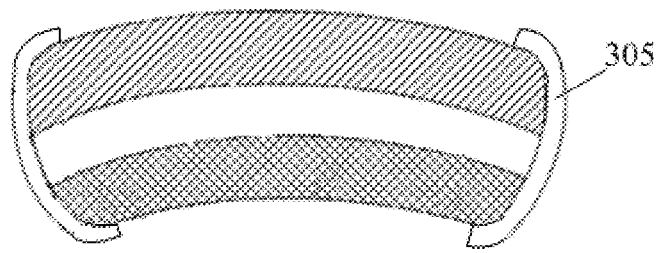
FIG. 2e shows a section diagram of the curved-surface display screen as provided according to an embodiment of the present invention.
Figure 3:
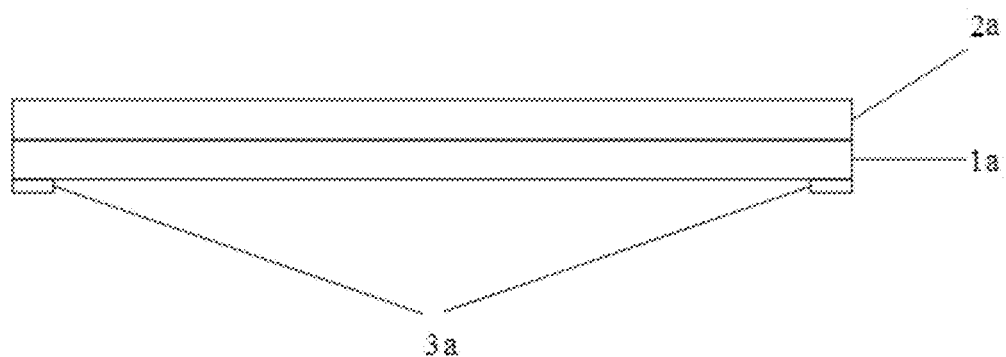
FIG. 3 shows a structural diagram of a display panel as provided according to an embodiment of the present invention.

In an embodiment, the cross section of the annular groove 205 includes a U shape, as shown in FIG. 2e, or an arc shape as shown in FIG. 2d. For example, the FIG. 2e shows a section diagram of the curved-surface display screen as provided according to an embodiment of the present invention. As shown in FIG. 2e, the cross section of the annular groove 305 is U-shape. FIG. 3 shows a structural diagram of a display panel as provided according to an embodiment of the present invention. As shown in FIG. 3, the display panel comprises a substrate 1a, an OLED module 2a located on a first surface of the substrate 1a, and a wiring region 3a located on a second surface of the substrate 1a, the second surface is opposite to the first surface, and the wiring region 3a is electrically connected with the OLED module 2a on the first surface.

In the display element as provided in the embodiment(s) of the present invention, the wiring region of a non-display portion is configured on the back of the substrate, and the wiring region is electrically connected with the OLED module on the front of the substrate. So that the wiring of the OLED module is achieved, and area of the non-display portion in the front of the display element is significantly reduced. Therefore, the element is enabled to display with a narrow frame or with a full screen, thus the display effect of the screen is enhanced and the visual experience of the user is improved.

In an embodiment of the present invention, the substrate 1a includes a via hole, and the circuit wire of the wiring region 3a can be connected through the via hole on the substrate 1a to the OLED module 2a located on the front surface of the substrate 1a. Specifically, the via hole and the circuit wire correspond one by one, or one via hole corresponds to a plurality of circuit wires, or one via hole corresponds to all circuit wires. The via hole may be prepared by laser drilling or a chemical method, and various kinds of conducting media may be evaporated to the wall of the via hole. Thus, the circuit wire at the wiring region 3a on the back of the substrate 1a can be electrically connected with the OLED module 2a on the front of the substrate 1a through the via hole.

Figure 4:
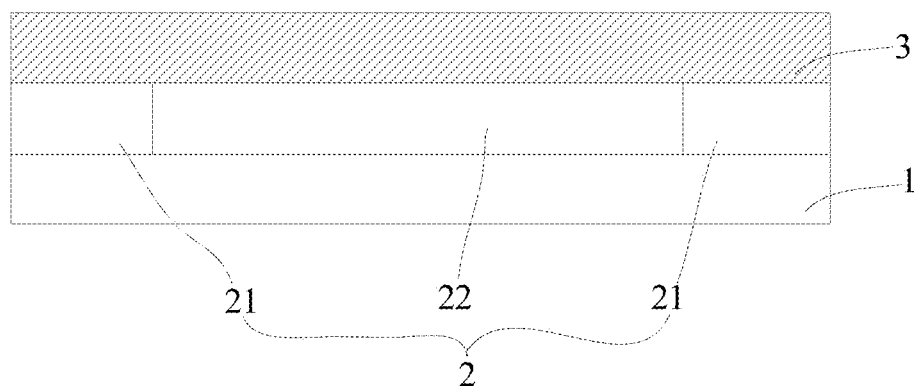
FIG. 4 shows a structural diagram of an OLED module as provided according to an embodiment of the present invention.

FIG. 4 shows a structural diagram of an OLED module as provided according to an embodiment of the present invention. As shown in FIG. 4, the OLED module includes a first module material layer 1, a second module material layer 3 stacked to the first module material layer 1, and at least one strain separating layer 2 located between the first module material layer 1 and the second module material layer 3. The strain separating layer 2 includes a chamber 22 and a resilient material layer 21 surrounding a periphery of the chamber 22.

The module material layer is a functional unit to constitute the flexible display module, and each module material layer may be further composed by a plurality functional layers. For example, the module material layer may be a flexible display screen body, a touch controlling layer, a polarizer layer, etc. In order to distinguish different module material layer regions, the terms of "first" and "second" are introduced for definition in the embodiment(s) of the present invention, such as the first module material layer 1 and the second module material layer 3, etc.

In the OLED module provided in the embodiment(s) of the present invention, the strain separating layer 2 is prepared between the first module material layer 1 and the second module material layer 3. So that transmission of deformation between the first module material layer 1 and the second module material layer 3 due to bending can be effectively prevented, and the deformation of the first module material layer 1 and the second module material layer 3 can be effectively reduced, the bending resistance of the property of the flexible display module can be effectively improved, the reliability of the product can be effectively improved.

However, the OLED module provided in the embodiment(s) of the present invention is not limited to that shown in FIG. 1, which includes only the first module material layer 1 and the second module material layer 3, and the OLED module may also include further more module material layer(s). The strain separating layer 2 may be prepared between any adjacent two module material layers. Neither the number of the module material layers nor between which two adjacent module material layers the strain separating layer 2 is configured are not specifically defined in the embodiment(s) of the present invention.

In an embodiment, the chamber 22 may be filled with gas or be set into a vacuum state, the deformation can be separated in both situation. When the chamber 22 is filled with gas, the gas pressure between inside and outside of the chamber 22 can be balanced.

In an embodiment, the gas may be air, or inert gases, or a combination thereof. The air is an abundant resource and is convenient to be collected. The total cost for manufacturing the flexible display module can be reduced by filling the chamber 22 with air. The gas may be an inert gas. The inert gas is stable in chemical properties, and thus it is not easy to start a chemical reaction with a matter in contact.

Therefore, the service life of the flexible display module is long, when the chamber 22 is filled with the inert gas. However, the type of the gas in the chamber 22 is not specifically defined in the embodiment(s) of the present invention.

The above description is only for the preferred embodiments of the present invention, and will not be used to define the protection scope of the present invention. Any modification, equivalent substitution or improvement made thereto within the spirit and principle of the present invention should fall in the protection scope of the present invention.

What is claimed is:

1. A method for assembling a curved-surface display screen, comprising:
    attaching a flexible display panel to a flexible glass to form an integral body; and
    mounting the integral body into a frame,
    wherein the frame surrounds a periphery of the integral body, and a perimeter of the inner periphery of the frame is less than the perimeter of the periphery of the integral body so that the integral body is bent into a curved surface relative to the frame.

2. The method for assembling a curved-surface display screen according to claim 1, wherein the attaching a flexible display panel to a flexible glass to form an integral body is performed in a laminating attaching manner or a rolling conveying attaching manner.

3. The method for assembling a curved-surface display screen according to claim 1, wherein the mounting the integral body into a frame comprises:
    embedding the integral body into the frame.

4. The method for assembling a curved-surface display screen according to claim 1, wherein the mounting the integral body into a frame comprises:
    frame-attaching the frame to the periphery of the integral body.

5. The method for assembling a curved-surface display screen according to claim 3, wherein the frame comprises an annular groove extending in a circumferential direction on the inner surface of the frame, the embedding the integral body into the frame comprises:
    embedding the periphery of the integral body into the annular groove.

6. The method for assembling a curved-surface display screen according to claim 1, wherein the attaching a flexible display panel to a flexible glass to form an integral body comprises:
    holding the flexible display panel horizontally by using a rolling conveying attaching apparatus;
    applying an adhesive onto the flexible display panel; and
    rolling-pressing the flexible glass onto the adhesive.

7. The method for assembling a curved-surface display screen according to claim 1, wherein the mounting the integral body into a frame comprises:
    frame-attaching the frame around the periphery of the integral body.

8. A curved-surface display screen, comprising:
    a flexible display panel;
    a flexible glass attached on the flexible display panel to form an integral body; and
    a frame;
    wherein the frame surrounds a periphery of the integral body, and a perimeter of the inner periphery of the frame is less than the perimeter of the periphery of the integral body so that the integral body is bent into a curved surface relative to the frame.

9. The curved-surface display screen according to claim 8, wherein the frame comprises an annular groove extending in a circumferential direction on the inner surface of the frame.

10. The curved-surface display screen according to claim 9, wherein a shape of a cross section of the annular groove comprises an arc shape or a U shape.

11. The curved-surface display screen according to claim 9, wherein a depth of the annular groove is 3-5 mm.

* * * * *